(12) United States Patent
Ito et al.

(10) Patent No.: US 9,773,864 B2
(45) Date of Patent: Sep. 26, 2017

(54) NITRIDE COMPOUND SEMICONDUCTOR

(71) Applicant: SHARP KABUSHIKI KAISHA, Sakai, Osaka (JP)

(72) Inventors: Nobuyuki Ito, Sakai (JP); Manabu Tohsaki, Sakai (JP); Atsushi Ogawa, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/127,642

(22) PCT Filed: Apr. 17, 2015

(86) PCT No.: PCT/JP2015/061860
§ 371 (c)(1),
(2) Date: Sep. 20, 2016

(87) PCT Pub. No.: WO2015/182283
PCT Pub. Date: Dec. 3, 2015

(65) Prior Publication Data
US 2017/0141187 A1 May 18, 2017

(30) Foreign Application Priority Data

May 26, 2014 (JP) ................. 2014-108159

(51) Int. Cl.
*H01L 29/78* (2006.01)
*H01L 29/06* (2006.01)
(Continued)

(52) U.S. Cl.
CPC ...... *H01L 29/0634* (2013.01); *H01L 23/3738* (2013.01); *H01L 29/1054* (2013.01);
(Continued)

(58) Field of Classification Search
CPC .............. H01L 29/66431; H01L 29/66462
See application file for complete search history.

(56) References Cited

U.S. PATENT DOCUMENTS 7,233,028 B2 * 6/2007 Weeks ................ H01L 29/0657
257/622
7,812,372 B2 * 10/2010 Okita ................ H01L 29/7371
257/187
(Continued)

FOREIGN PATENT DOCUMENTS

JP 2003-59948 A 2/2003
JP 2005-85852 A 3/2005
(Continued)

OTHER PUBLICATIONS

International Search Report for PCT/JP2015/061860 (PCT/ISA/210) dated Jun. 9, 2015.
(Continued)

*Primary Examiner* — Benjamin Sandvik
(74) *Attorney, Agent, or Firm* — Birch, Stewart, Kolasch & Birch, LLP

(57) ABSTRACT

A nitride compound semiconductor has a substrate and a nitride compound semiconductor stack on the substrate. The nitride compound semiconductor stack includes a multilayer buffer layer, a channel layer on this multilayer buffer layer, and an electron supply layer on this channel layer. A recess extends from the surface of the electron supply layer through the channel layer and the multilayer buffer layer. A heat dissipation layer in this recess is contiguous to the multilayer buffer layer and the channel layer and has a higher thermal conductivity than the multilayer buffer layer.

5 Claims, 10 Drawing Sheets

(51) Int. Cl.
*H01L 29/778* (2006.01)
*H01L 29/812* (2006.01)
*H01L 29/20* (2006.01)
*H01L 29/205* (2006.01)
*H01L 29/10* (2006.01)
*H01L 23/373* (2006.01)
*H01L 29/66* (2006.01)

(52) U.S. Cl.
CPC ........ *H01L 29/2003* (2013.01); *H01L 29/205* (2013.01); *H01L 29/66462* (2013.01); *H01L 29/7787* (2013.01); *H01L 29/812* (2013.01)

(56) References Cited

U.S. PATENT DOCUMENTS

| | | |
|---|---|---|
| 2005/0051804 A1 | 3/2005 | Yoshida |
| 2009/0146186 A1* | 6/2009 | Kub .................... H01L 29/1602 257/194 |
| 2013/0020581 A1 | 1/2013 | Teraguchi et al. |
| 2013/0146946 A1 | 6/2013 | Tsurumi et al. |

FOREIGN PATENT DOCUMENTS

| | | |
|---|---|---|
| JP | 2012-38885 A | 2/2012 |
| JP | 2013-26321 A | 2/2013 |

OTHER PUBLICATIONS

Written Opinion of the International Searching Authority for PCT/JP2015/061860 (PCT/ISA/237) dated Jun. 9, 2015.

* cited by examiner

NITRIDE COMPOUND SEMICONDUCTOR

TECHNICAL FIELD

The present invention relates to a nitride compound semiconductor.

BACKGROUND ART

A typical known nitride compound semiconductor for semiconductor electronic devices is a nitride compound semiconductor having an AlGaN—GaN heterojunction. This nitride compound semiconductor unit is composed of, for example, a substrate, a nitride compound semiconductor stack on the substrate, source and drain electrodes, and a gate electrode between the source and drain electrodes. The substrate is a sapphire, Si, or similar substrate. The semiconductor stack is composed of a buffer layer, a channel layer typically made of GaN, and an AlGaN barrier layer. The source and drain electrodes make ohmic contacts with a two-dimensional electron gas formed at the interface between the barrier and channel layers.

In fabricating this known nitride compound semiconductor, it is not a very big problem if the nitride compound semiconductor stack is formed on a sapphire or SiC substrate. A Si substrate, however, has a coefficient of thermal expansion smaller than that of the nitride compound semiconductor stack. After the growth of the nitride compound semiconductor stack, the Si substrate not only becomes convex downward but can also crack because of the stress in the crystal itself.

An example of a proposed solution to this problem is methods presented in PTL 1 and 2. In these methods, two alternately grown layers with different compositions, more specifically a first layer with a composition formula of $Al_xIn_yGa_{1-x-y}As_uP_vN_{1-u-v}$ ($0 \leq x \leq 1$, $0 \leq y \leq 1$, $x+y \leq 1$, $0 \leq u < 1$, $0 \leq v < 1$, and $u+v < 1$) and a second layer with a composition formula of $Al_aIn_bGa_{1-a-b}As_cP_dN_{1-c-d}$ ($0 \leq a \leq 1$, $0 \leq b \leq 1$, $a+b \leq 1$, $0 \leq c < 1$, $0 \leq d < 1$, and $c+d < 1$), form a multilayer buffer layer, and this multilayer buffer layer is used to mitigate the difference in the coefficient of thermal expansion between a Si substrate and a nitride compound semiconductor stack.

CITATION LIST

Patent Literature

PTL 1: Japanese Unexamined Patent Application Publication No. 2003-59948
PTL 2: Japanese Unexamined Patent Application Publication No. 2005-85852

SUMMARY OF INVENTION

Technical Problem

This multilayer buffer layer, however, has a thermal conductivity considerably smaller than that of the first or second layer alone, often as small as ⅒ or less (see, e.g., Journal of Crystal Growth 298 (2007), pages 251-253). Thus, semiconductor units described in the aforementioned patent literatures are of low heat dissipation capacity because of the presence of the multilayer buffer layer. The channel layer on the multilayer buffer layer therefore heats as the semiconductor electronic device is operated. The temperature rise leads to increased channel resistance and can significantly affect the reliability of the semiconductor electronic device.

Thus, an object of the present invention is to prevent the loss of heat dissipation capacity due to the presence of a multilayer buffer layer and provide a nitride compound semiconductor that makes semiconductor electronic devices using the nitride compound semiconductor highly reliable.

Solution to Problem

To solve the above problem, a nitride compound semiconductor according to the present invention includes:
a substrate; and
a nitride compound semiconductor stack on the substrate.
The nitride compound semiconductor stack includes a multilayer buffer layer, a channel layer on this multilayer buffer layer, and an electron supply layer on this channel layer.

In the nitride compound semiconductor,
a recess extends from the surface of the electron supply layer through the channel layer and the multilayer buffer layer; and
a heat dissipation layer is in the recess contiguous to the multilayer buffer layer and a layer on this multilayer buffer layer and has a higher thermal conductivity than the multilayer buffer layer.

Advantageous Effects of Invention

According to the present invention, the nitride compound semiconductor has a recess that extends from the surface of the electron supply layer through the electron supply layer, the channel layer, and the multilayer buffer layer. In this recess, there is a heat dissipation layer contiguous to the multilayer buffer layer and a layer on this multilayer buffer layer and having a higher thermal conductivity than the multilayer buffer layer. This improves the dissipation of heat from the nitride compound semiconductor, which includes a multilayer buffer layer having a low thermal conductivity in a direction perpendicular to the substrate, by ensuring that the heat transmitted from the surface of the electron supply layer toward the multilayer buffer layer is released to the outside of the nitride compound semiconductor through the heat dissipation layer. This nitride compound semiconductor therefore makes semiconductor electron devices using the nitride compound semiconductor highly reliable.

DESCRIPTION OF EMBODIMENTS

Embodiment 1

Figure 1:
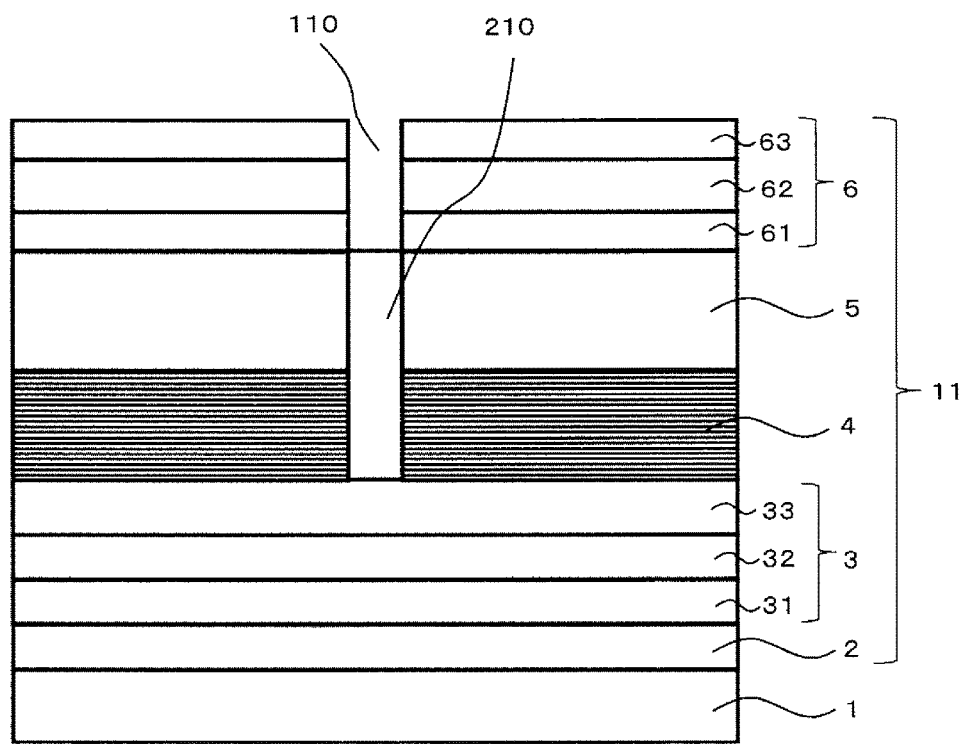
FIG. 1 is a schematic cross-section of a nitride compound semiconductor according to Embodiment 1 of the present invention.
Figure 2:
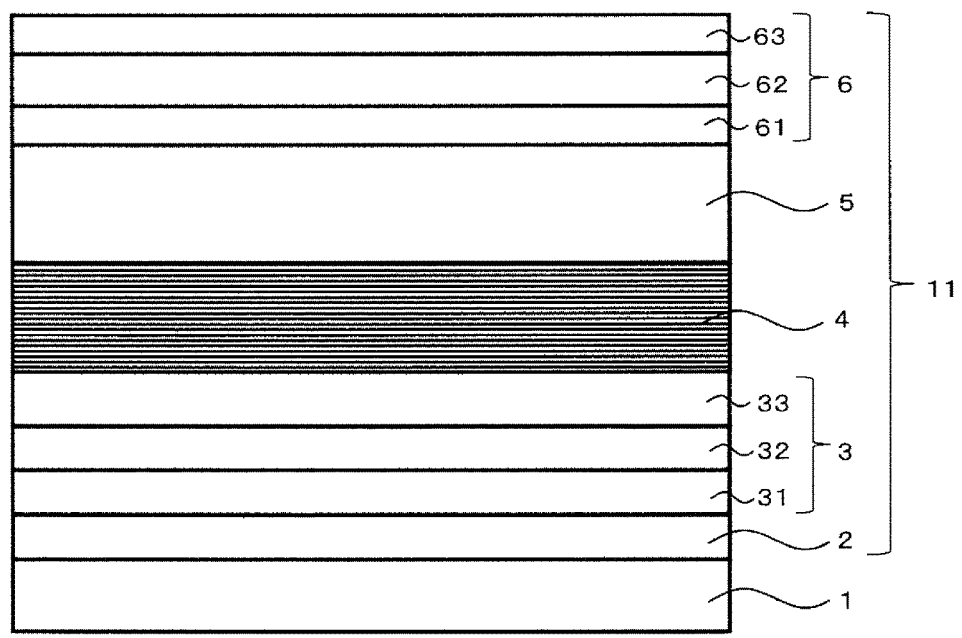
FIG. 2 is a schematic cross-section for illustrating a process for the production of the nitride compound semiconductor in FIG. 1.

A nitride compound semiconductor according to Embodiment 1 of the present invention includes, as illustrated in FIG. 1, a substrate 1 and a nitride compound semiconductor stack 11 on this substrate 1. The nitride compound semiconductor can be, for example, an epitaxial wafer.

The substrate 1 is, for example, a 0.01-Ω·cm boron-doped CZ Si substrate. The substrate 1 can be any substrate on which a nitride compound semiconductor can be epitaxially grown. Examples include Si, SiC, GaN and sapphire substrates.

The nitride compound semiconductor stack 11 consists of an initial growth layer 2, a composition-gradient buffer layer 3, a multilayer buffer layer 4, a GaN channel layer 5, and an electron supply layer 6 and has a structure in which the initial growth layer 2, the composition-gradient buffer layer 3, the multilayer buffer layer 4, the GaN channel layer 5, and the electron supply layer 6 are stacked in order.

The initial growth layer 2 is, for example, a 100-nm thick AlN layer.

The composition-gradient buffer layer 3 consists of an $Al_{0.7}Ga_{0.3}N$ layer 31, an $Al_{0.4}Ga_{0.6}N$ layer 32, and an $Al_{0.1}Ga_{0.9}N$ layer 33 and is structured as a stack of the $Al_{0.7}Ga_{0.3}N$ layer 31, the $Al_{0.4}Ga_{0.6}N$ layer 32, and the $Al_{0.1}Ga_{0.9}N$ layer 33 on the initial growth layer 2 stacked in descending order of the compositional proportion of Al. The $Al_{0.7}Ga_{0.3}N$ layer 31 is, for example, 200 nm thick. The $Al_{0.4}Ga_{0.6}N$ layer 32 is, for example, 400 nm thick. The $Al_{0.2}Ga_{0.9}N$ layer 33 is, for example, 400 nm thick.

The multilayer buffer layer 4 consists of an AlN layer as a first layer with a composition of $Al_xIn_yGa_{1-x-y}As_uP_vN_{1-u-v}$ ($0 \leq x \leq 1$, $0 \leq y \leq 1$, $x+y \leq 1$, $0 \leq u < 1$, $0 \leq v < 1$, and $u+v < 1$) and an $Al_{0.1}Ga_{0.9}N$ layer as a second layer with a composition of $Al_aIn_bGa_{1-a-b}As_cP_dN_{1-c-d}$ ($0 \leq a \leq 1$, $0 \leq b \leq 1$, $a+b \leq 1$, $0 \leq c < 1$, $0 \leq d < 1$, and $c+d < 1$) and has a structure in which the first and second layers are alternately stacked in multiple sets. The AlN layers are, for example, 3 nm thick. The $Al_{0.1}Ga_{0.9}N$ layers are, for example, 30 nm thick.

A multilayer buffer layer as mentioned herein refers to a stack of multiple layers each having a composition of $Al_xIn_yGa_{1-x-y}As_uP_vN_{1-u-v}$ ($0 \leq x \leq 1$, $0 \leq y \leq 1$, $x+y \leq 1$, $0 \leq u < 1$, $0 \leq v < 1$, and $u+v < 1$) with an overall structure in which a set of multiple layers with different compositions is repeated. The multilayer buffer layer can be, for example, a superlattice buffer layer.

Not only when having a structure in which the first and second layers are alternately repeated, the multilayer buffer layer 4 may have a structure such as one in which the first and second layers are randomly stacked, or may alternatively have a structure in which the first and second layers are alternately repeated in a region and randomly stacked in another.

The GaN channel layer 5 is, for example, a 1-μm thick GaN layer.

The electron supply layer 6 consists of an AlN characteristic-improving layer 61, an AlGaN barrier layer 62, and a GaN capping layer 63 and is structured as a stack of the AlN characteristic-improving layer 61, the AlGaN barrier layer 62, and the GaN capping layer 63 stacked in order on the GaN channel layer 5. The AlN characteristic-improving layer 61 is, for example, 1 nm thick. The AlGaN barrier layer 62 is, for example, 20-nm thick $Al_{0.2}Ga_{0.8}N$. The GaN capping layer 63 is, for example, 1 nm thick.

The nitride compound semiconductor stack 11 also has a recess 110 that extends from the surface of the electron supply layer 6 to the composition-gradient buffer layer 3 through the electron supply layer 6, the GaN channel layer 5, and the multilayer buffer layer 4. In this recess 110, there is a heat dissipation layer 210 contiguous to the multilayer buffer layer 4 and the GaN channel layer 5. This heat dissipation layer 210 is a layer of GaN, a material that has a higher thermal conductivity than the multilayer buffer layer 4 and offers superior heat dissipation, and prevents the multilayer buffer layer 4 and the GaN channel layer 5 from being exposed in the recess 110.

The recess 110 is in a portion such as an isolated portion that does not contribute to the operation of a nitride compound semiconductor unit made with this semiconductor.

A process for producing this nitride compound semiconductor is as follows.

First, a substrate 1 is treated with a hydrofluoric acid etchant to remove the surface oxide film. This substrate 1 is then loaded into a metalorganic chemical vapor deposition (MOCVD) system, and the surface of the substrate 1 is cleaned at a chamber pressure of 13.3 kPa with the temperature of the substrate 1 set at 1100° C.

Then with the temperature of the substrate 1 and the chamber pressure maintained constant, a flow of ammonia $NH_3$ (12.5 slm) is passed to nitride the surface of the substrate 1.

Then with the TMA flow rate of 117 μmol/min and the $NH_3$ flow rate of 12.5 slm, a 100-nm thick initial growth layer 2 is formed on the substrate 1.

Then the temperature of the substrate 1 is set at 1150° C., and a composition-gradient buffer layer 3 is formed as follows:
  with the TMG flow rate of 57 μmol/min, the TMA flow rate of 97 μmol/min, and the $NH_3$ flow rate of 12.5 slm, a 200-nm thick $Al_{0.7}Ga_{0.3}N$ layer 31 is formed on the initial growth layer 2;
  with the TMG flow rate of 99 μmol/min, the TMA flow rate of 55 μmol/min, and the $NH_3$ flow rate of 12.5 slm, a 400-nm thick $Al_{0.4}Ga_{0.6}N$ layer 32 is formed on the $Al_{0.7}Ga_{0.3}N$ layer 31; and
  with the TMG flow rate of 137 μmol/min, the TMA flow rate of 18 μmol/min, and the $NH_3$ flow rate of 12.5 slm, a 400-nm thick $Al_{0.1}Ga_{0.9}N$ layer 33 is formed on the $Al_{0.4}Ga_{0.6}N$ layer 32.

An AlN layer (3 nm thick)/$Al_{0.1}Ga_{0.9}N$ layer (30 nm thick) is then repeatedly grown to form a multilayer buffer layer 4 on the $Al_{0.1}Ga_{0.9}N$ layer 33.

Then with the TMG flow rate of 50 μmol and the $NH_3$ flow rate of 12.5 slm, a 1-μm thick GaN channel layer 5 is formed on the multilayer buffer layer 4.

Then on the GaN channel layer 5, an AlN characteristic-improving layer 61 (1 nm thick), an $Al_{0.2}Ga_{0.8}N$ barrier layer (20 nm thick), and a GaN capping layer 63 (1 nm thick) are sequentially grown to make a stack, forming an electrode supply layer 6.

Figure 3:
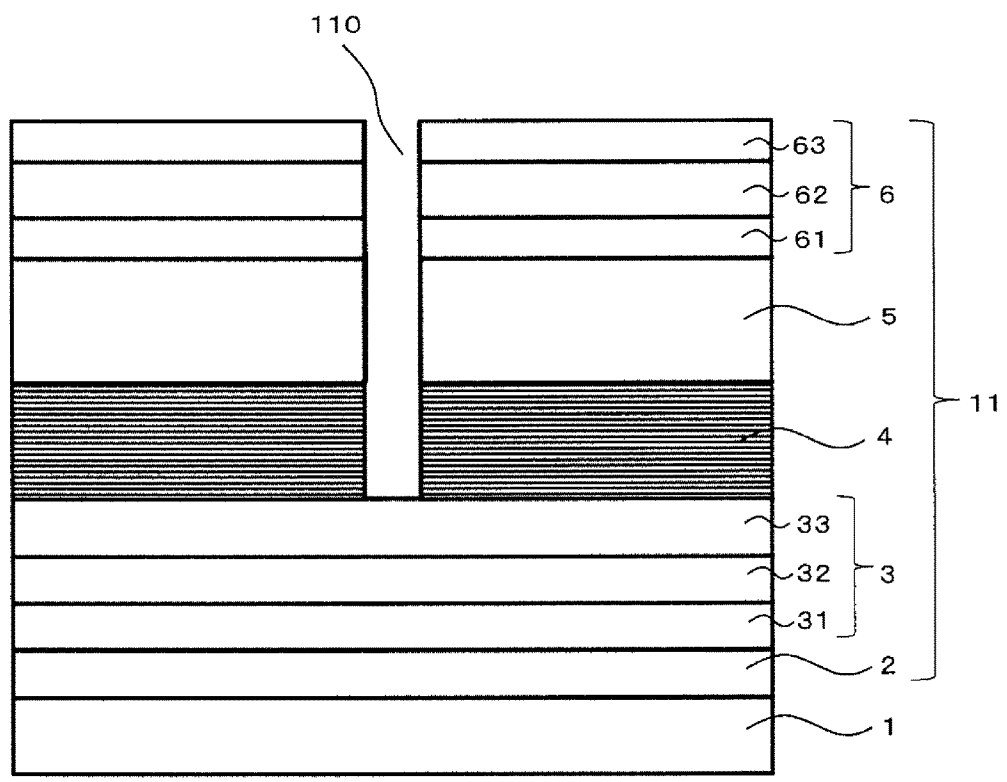
FIG. 3 is a schematic cross-section for illustrating a process for the production of the nitride compound semiconductor in FIG. 1, continued from FIG. 2.

The multilayer buffer layer 4, the GaN channel layer 5, and the electron supply layer 6 are then etched to create a recess 110 as illustrated in FIG. 3, and a GaN heat dissipation layer 210 is formed in this recess 110. The creation of the recess 110 is through, for example, $SiO_2$ deposition on the electron supply layer 6 using a sputtering system, patterning to remove $SiO_2$ from the area where the heat dissipation layer 210 is to be formed and leave the area where the heat dissipation layer 210 is not to be formed covered with $SiO_2$, and RIE dry etching with a fluorine gas. The deposited $SiO_2$ is removed after the formation of the heat dissipation layer 210.

The nitride compound semiconductor according to Embodiment 1 has a recess 110 and a heat dissipation layer 210 in this recess 110. The recess 110 extends from the surface of the electron supply layer 6 to the composition-gradient buffer layer 3 through the electron supply layer 6, the GaN channel layer 5, and the multilayer buffer layer 4. The heat dissipation layer 210 is contiguous to the multilayer buffer layer 4 and the GaN channel layer 5 on this multilayer buffer layer 4 and has a higher thermal conductivity in a direction perpendicular to the substrate 1 than the multilayer buffer layer 4. This prevents the loss of heat dissipation capacity due to the presence of the low-thermal-conductivity multilayer buffer layer 4 because the heat transmitted from the surface of the electron supply layer 6 toward the multilayer buffer layer 4 is released to the outside of the nitride compound semiconductor through the heat dissipation layer 210, limiting the increase in the temperature of the GaN channel layer 5. This nitride compound semiconductor therefore makes semiconductor electronic devices using the nitride compound semiconductor highly reliable.

Embodiment 2

Figure 4:
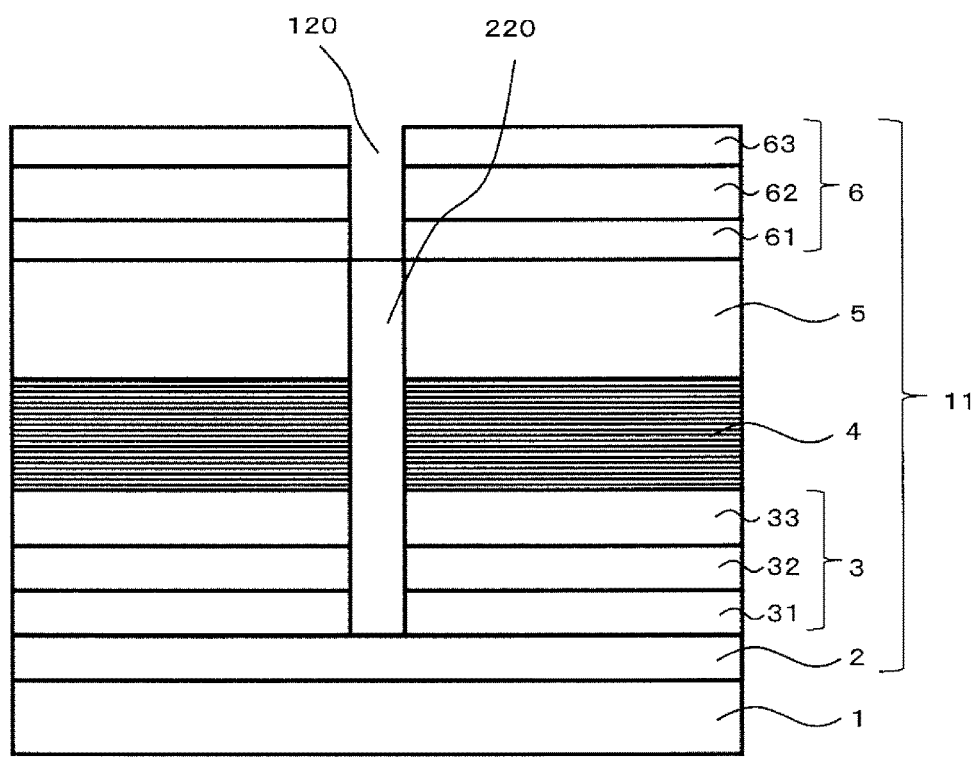
FIG. 4 is a schematic cross-section of a nitride compound semiconductor according to Embodiment 2 of the present invention.

A nitride compound semiconductor according to Embodiment 2 has, as illustrated in FIG. 4, a recess 120 in the nitride compound semiconductor stack 11 according to Embodiment 1 that extends from the surface of the electron supply layer 6 to the initial growth layer 2 through the electron supply layer 6, the GaN channel layer 5, the multilayer buffer layer 4, and the composition-gradient buffer layer 3, with a GaN heat dissipation layer 220 in this recess 120. The structural portions identical to those in Embodiment 1 above are given the same numerals as in Embodiment 1. To these structural portions, the descriptions in Embodiment 1 apply.

Besides being contiguous to the GaN channel layer 5, the multilayer buffer layer 4, and the composition-gradient buffer layer 3, the heat dissipation layer 220 prevents the GaN channel layer 5, the multilayer buffer layer 4, and the composition-gradient buffer layer 3 from being exposed in the recess 120. This recess 120 is in a portion (e.g., an isolated portion) that does not contribute to the operation of a nitride compound semiconductor unit made with this semiconductor.

The production of the nitride compound semiconductor according to Embodiment 2 is through, for example, the same process as that of the nitride compound semiconductor according to Embodiment 1.

The nitride compound semiconductor according to Embodiment 2 has a recess 120 that extends from the surface of the electron supply layer 6 to the initial growth layer 2 through the electron supply layer 6, the GaN channel layer 5, the multilayer buffer layer 4, and the composition-gradient buffer layer 3 with a heat dissipation layer 220 in this recess 120. This ensures reproducible stable etching because the AlN initial growth layer 2 serves as an etch-stop layer.

Embodiment 3

Figure 5:
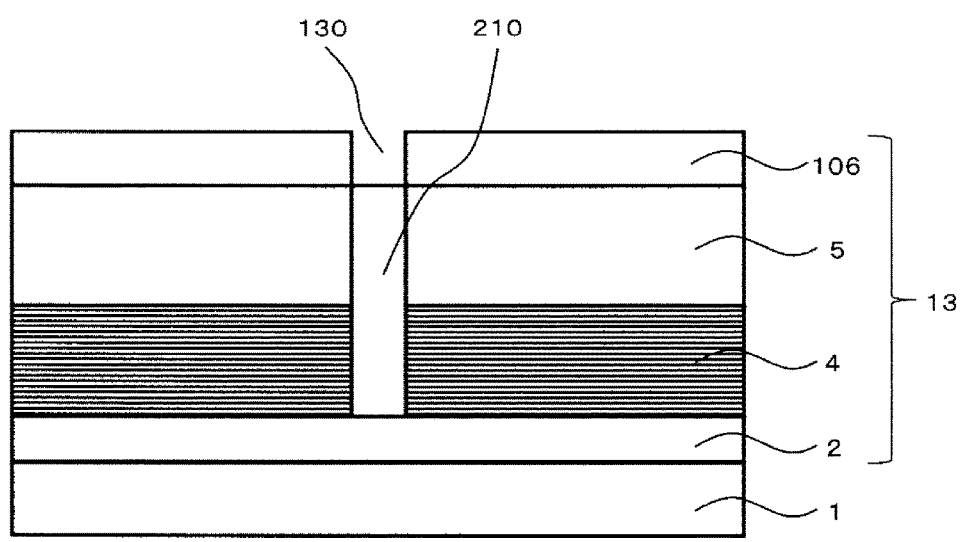
FIG. 5 is a schematic cross-section of a nitride compound semiconductor according to Embodiment 3 of the present invention.

A nitride compound semiconductor according to Embodiment 3 includes, as illustrated in FIG. 5, a substrate 1 and a nitride compound semiconductor stack 13 on this substrate 1. The nitride compound semiconductor stack 13 consists of an initial growth layer 2, a multilayer buffer layer 4, a GaN channel layer 5, and an electron supply layer 106 and has a structure in which the initial growth layer 2, the multilayer buffer layer 4, the GaN channel layer 5, and the electron supply layer 106 are stacked in order. The structural portions identical to those in Embodiments 1 and 2 above are given the same numerals as in Embodiments 1 and 2. To these structural portions, the descriptions in Embodiments 1 and 2 apply.

The electron supply layer 106 is, for example, a 25-nm thick $Al_{0.22}Ga_{0.78}N$ barrier layer. In Embodiment 3, the thickness of the initial growth layer 2 is 120 nm, the multilayer buffer layer 4 is a stack in which an AlN layer (5 nm thick)/$Al_{0.1}Ga_{0.9}N$ layer (30 nm thick) has been repeatedly grown, and the thickness of the GaN channel layer 5 is 1.5 nm, for example.

The nitride compound semiconductor stack 13 has a recess 130 that extends from the surface of the electron supply layer 106 to the initial growth layer 2 through the electron supply layer 106, the GaN channel layer 5, and the multilayer buffer layer 4. In this recess 130, there is a GaN heat dissipation layer 210 contiguous to the multilayer buffer layer 4 and the GaN channel layer 5. The recess 130 is in a portion (e.g., an isolated portion) that does not contribute to the operation of a nitride compound semiconductor unit made with this semiconductor.

A process for producing this nitride compound semiconductor is as follows.

First, a substrate 1 is treated with a hydrofluoric acid etchant to remove the surface oxide film. This substrate 1 is then loaded into a metalorganic chemical vapor deposition (MOCVD) system, and the surface of the substrate 1 is cleaned at a chamber pressure of 13.3 kPa with the temperature of the substrate 1 set at 1100° C.

Then with the temperature of the substrate 1 and the chamber pressure maintained constant, a flow of ammonia $NH_3$ (12.5 slm) is passed to nitride the surface of the substrate 1.

Then with the TMA flow rate of 117 µmol/min and the $NH_3$ flow rate of 12.5 slm, a 120-nm thick AlN initial growth layer 2 is formed on the substrate 1.

The initial growth layer 2 is then coated with $SiO_2$, for example, deposited using a sputtering system. The deposited coating is patterned to remove $SiO_2$ from the area where a heat dissipation layer 210 is to be formed and leave the area where a multilayer buffer layer 4 is to be grown covered with $SiO_2$. Then a heat dissipation layer 210 is formed. After the formation of the heat dissipation layer 210, $SiO_2$ is removed.

The heat dissipation layer 210 is then coated with $SiO_2$ using a sputtering system. The deposited coating is patterned to leave only the surface of the heat dissipation layer 210 covered with $SiO_2$. Then an AlN layer (3 nm thick)/$Al_{0.1}Ga_{0.9}N$ layer (30 nm thick) is repeatedly grown to form a multilayer buffer layer 4 on the initial growth layer 2. Then on the multilayer buffer layer 4, a 1.5-μm thick GaN channel layer 5 and a 25-nm thick $Al_{0.22}Ga_{0.78}N$ barrier layer as an electron supply layer 106 are sequentially grown. After that, the $SiO_2$ covering the surface of the heat dissipation layer 210 is removed.

In the nitride compound semiconductor according to Embodiment 3, the multilayer buffer layer 4 is on the initial growth layer 2, and the electron supply layer 106 is an $Al_{0.22}Ga_{0.78}N$ barrier layer. This delivers cost reductions by allowing the manufacturer to limit increases in the temperature of the GaN channel layer 5 with a simple construction.

Embodiment 4

Figure 6:
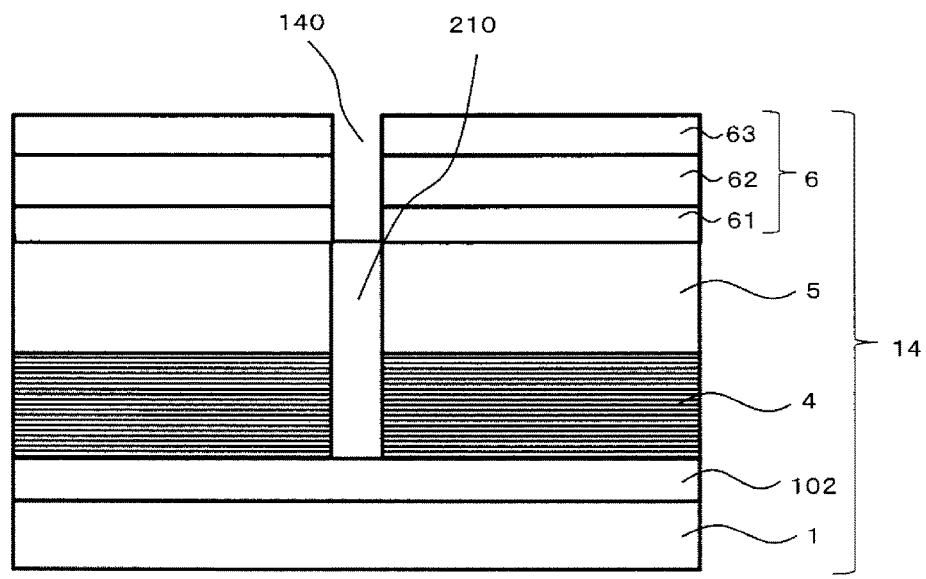
FIG. 6 is a schematic cross-section of a nitride compound semiconductor according to Embodiment 4 of the present invention.

A nitride compound semiconductor according to Embodiment 4 includes, as illustrated in FIG. 6, a substrate 1 and a nitride compound semiconductor stack 14 on this substrate 1. The nitride compound semiconductor stack 14 consists of an initial growth layer 102, a multilayer buffer layer 4, a GaN channel layer 5, and an electron supply layer 6 and has a structure in which the initial growth layer 102, the multilayer buffer layer 4, the GaN channel layer 5, and the electron supply layer 6 are stacked in order. The structural portions identical to those in Embodiments 1 to 3 above are given the same numerals as in Embodiments 1 to 3. To these structural portions, the descriptions in Embodiments 1 to 3 apply.

The initial growth layer 102 is a layer of low-temperature-grown GaN and has a thickness of, for example, 50 nm. In Embodiment 4, the multilayer buffer layer 4 is a stack in which an AlN layer (3 nm thick)/$Al_{0.1}Ga_{0.9}N$ layer (25 nm thick) has been repeatedly grown, and the thickness of the GaN channel layer 5 is 1.5 nm, for example.

The nitride compound semiconductor stack 14 has a recess 140 that extends from the surface of the electron supply layer 6 to the initial growth layer 102 through the electron supply layer 6, the GaN channel layer 5, and the multilayer buffer layer 4. This recess 140 is in a portion (e.g., an isolated portion) that does not contribute to the operation of a nitride compound semiconductor unit made with this semiconductor. In the recess 140, there is a GaN heat dissipation layer 210 contiguous to the multilayer buffer layer 4 and the GaN channel layer 5.

The production of the nitride compound semiconductor according to Embodiment 4 is through, for example, the same process as that of the nitride compound semiconductor according to Embodiment 3.

The nitride compound semiconductor according to Embodiment 4, in which the initial growth layer 102 can be a GaN layer, allows the manufacturer to use a substrate and a structure suitable for this GaN initial growth layer 102.

Embodiment 5

Figure 7:
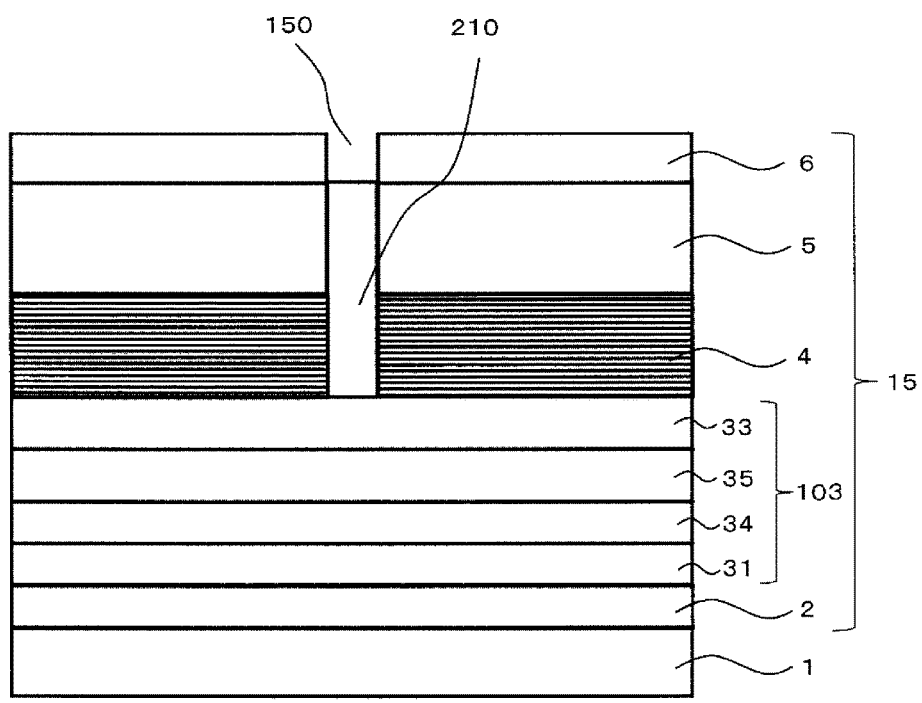
FIG. 7 is a schematic cross-section of a nitride compound semiconductor according to Embodiment 5 of the present invention.

A nitride compound semiconductor according to Embodiment 5 includes, as illustrated in FIG. 7, a substrate 1 and a nitride compound semiconductor stack 15 on this substrate 1. The nitride compound semiconductor stack 15 consists of an initial growth layer 2, a composition-gradient buffer layer 103, a multilayer buffer layer 4, a GaN channel layer 5, and an electron supply layer 106 and has a structure in which the initial growth layer 2, the composition-gradient buffer layer 103, the multilayer buffer layer 4, the GaN channel layer 5, and the electron supply layer 106 are stacked in order. The structural portions identical to those in Embodiments 1 to 4 above are given the same numerals as in Embodiments 1 to 4. To these structural portions, the descriptions in Embodiments 1 to 4 apply.

The composition-gradient buffer layer 103 consists of an $Al_{0.7}Ga_{0.3}N$ layer 31, an $Al_{0.5}Ga_{0.5}N$ layer 34, an $Al_{0.3}Ga_{0.7}N$ layer 35, and an $Al_{0.1}Ga_{0.9}N$ layer 33 and is structured as a stack in which the composition of Al decreases stepwise on the initial growth layer 2. The $Al_{0.7}Ga_{0.3}N$ layer 31 is, for example, 200 nm thick. The $Al_{0.5}Ga_{0.5}N$ layer 34 is, for example, 200 nm thick. The $Al_{0.3}Ga_{0.7}N$ layer 35 is, for example, 300 nm thick. The $Al_{0.1}Ga_{0.9}N$ layer 33 is, for example, 400 nm thick.

The nitride compound semiconductor stack 15 has a recess 150 that extends from the surface of the electron supply layer 106 to the composition-gradient buffer layer 103 through the electron supply layer 106, the GaN channel layer 5, and the multilayer buffer layer 4. In this recess 150, there is a GaN heat dissipation layer 210 contiguous to the multilayer buffer layer 4 and the GaN channel layer 5.

The production of the nitride compound semiconductor according to Embodiment 5 is through, for example, the same process as that of the nitride compound semiconductor according to Embodiment 1.

The nitride compound semiconductor according to Embodiment 5 has a composition-gradient buffer layer 103 formed by an $Al_{0.7}Ga_{0.3}N$ layer 31, an $Al_{0.5}Ga_{0.5}N$ layer 34, an $Al_{0.3}Ga_{0.7}N$ layer 35, and an $Al_{0.1}Ga_{0.9}N$ layer 33 stacked in order. This gives the manufacturer detailed control over the warp in the nitride compound semiconductor.

Embodiment 6

Figure 8:
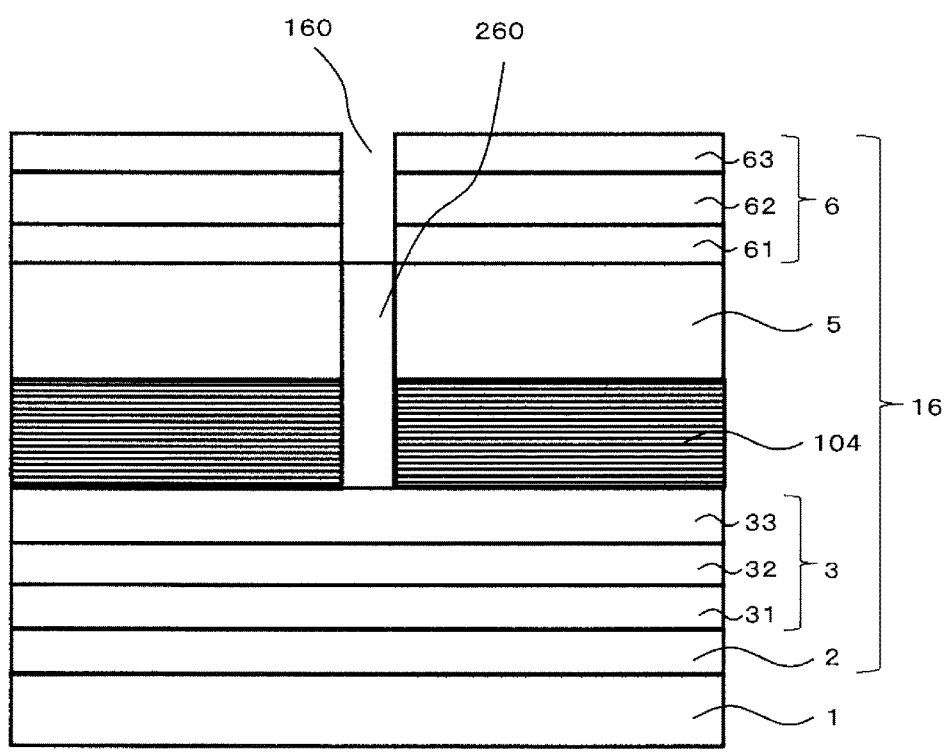
FIG. 8 is a schematic cross-section of a nitride compound semiconductor according to Embodiment 6 of the present invention.

A nitride compound semiconductor according to Embodiment 6 includes, as illustrated in FIG. 8, a substrate 1 and a nitride compound semiconductor stack 16 on this substrate 1. The nitride compound semiconductor stack 16 consists of an initial growth layer 2, a composition-gradient buffer layer 3, a multilayer buffer layer 104, a GaN channel layer 5, and an electron supply layer 6 and has a structure in which the initial growth layer 2, the composition-gradient buffer layer 3, the multilayer buffer layer 104, the GaN channel layer 5, and the electron supply layer 6 are stacked in order. The structural portions identical to those in Embodiments 1 to 5 above are given the same numerals as in Embodiments 1 to 5. To these structural portions, the descriptions in Embodiments 1 to 5 apply.

The multilayer buffer layer 104 consists of an AlN layer as a first layer, an $Al_{0.1}Ga_{0.5}N$ layer as a second layer, and an $Al_{0.5}Ga_{0.5}N$ layer as a third layer and is structured as a stack in which an $Al_{0.5}Ga_{0.5}N$ layer/AlN layer/$Al_{0.1}Ga_{0.9}N$ layer repeated on the composition-gradient buffer layer 3. The AlN layers are, for example, 3 nm thick. The $Al_{0.1}Ga_{0.9}N$ layers are, for example, 25 nm thick. The $Al_{0.5}Ga_{0.5}N$ layers are, for example, 5 nm thick.

The nitride compound semiconductor stack 16 has a recess 160 that extends from the surface of the electron supply layer 6 to the composition-gradient buffer layer 3 through the electron supply layer 6, the GaN channel layer 5, and the multilayer buffer layer 104. In this recess 160, there is a GaN heat dissipation layer 260.

Besides being contiguous to the GaN channel layer 5 and the multilayer buffer layer 104, the heat dissipation layer 260 prevents the GaN channel layer 5 and the multilayer buffer layer 104 from being exposed in the recess 160.

The production of the nitride compound semiconductor according to Embodiment 6 is through, for example, the same process as that of the nitride compound semiconductor according to Embodiment 1.

In the nitride compound semiconductor according to Embodiment 6, the multilayer buffer layer 104 has a structure in which growing an $Al_{0.5}/Ga_{0.5}N$ layer/AlN layer/$Al_{0.1}Ga_{0.9}N$ layer has been repeated multiple times. This leads to improved crystallinity of the multilayer buffer layer 104.

Embodiment 7

Figure 9:
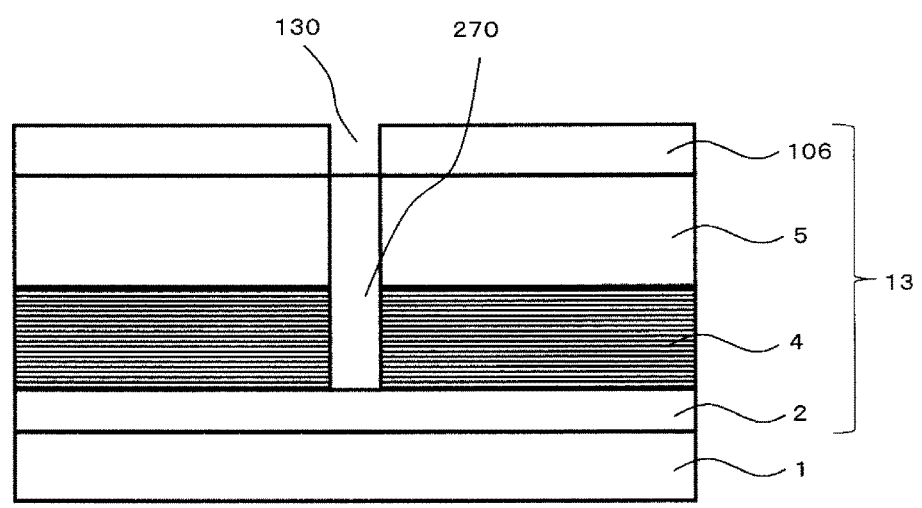
FIG. 9 is a schematic cross-section of a nitride compound semiconductor according to Embodiment 7 of the present invention.

A nitride compound semiconductor according to Embodiment 7 has, as illustrated in FIG. 9, a heat dissipation layer 270 in the recess 130 in the nitride compound semiconductor stack 13 according to Embodiment 3, with the heat dissipation layer 270 contiguous to the GaN channel layer 5 and the multilayer buffer layer 4. The structural portions identical to those in Embodiments 1 to 6 above are given the same numerals as in Embodiments 1 to 6. To these structural portions, the descriptions in Embodiments 1 to 6 apply.

The heat dissipation layer 270 is a layer of AlN, a material having a higher thermal conductivity than GaN (the thermal conductivity of AlN is 2.9 W/cm·K, whereas that of GaN is 1.3 W/cm·K), and prevents the GaN channel layer 5 and the multilayer buffer layer 4 from being exposed in the recess 130.

The production of the nitride compound semiconductor according to Embodiment 7 is through, for example, the same process as that of the nitride compound semiconductor according to Embodiment 3.

In the nitride compound semiconductor according to Embodiment 7, the heat dissipation layer 270 is made of AlN, a material having a higher thermally conductivity than GaN. This allows for reliable limitation of increases in the temperature of the GaN channel layer 5.

Embodiment 8

Figure 10:
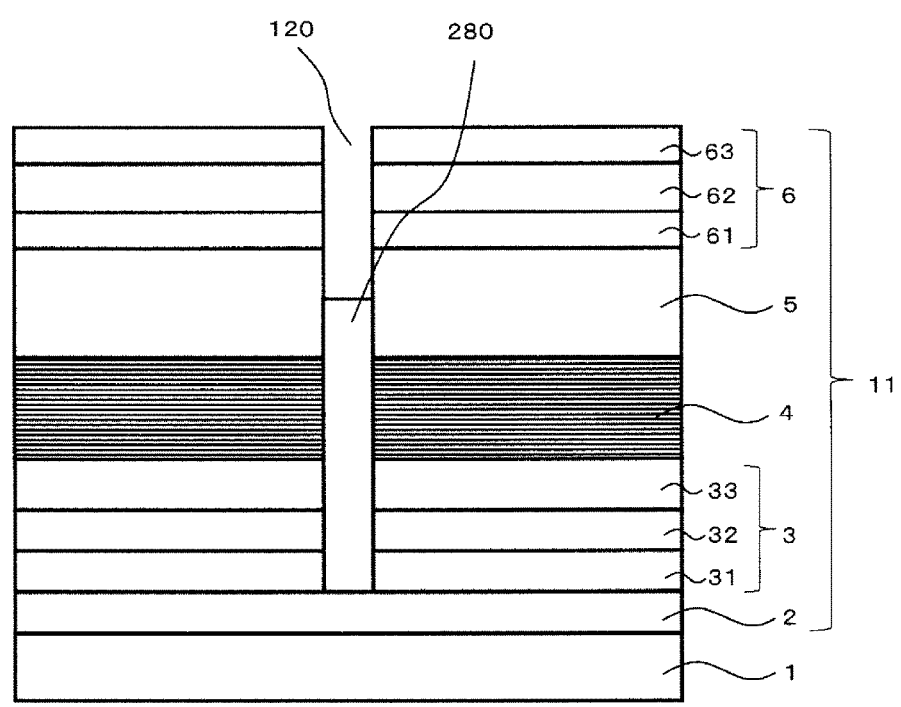
FIG. 10 is a schematic cross-section of a nitride compound semiconductor according to Embodiment 8 of the present invention.

A nitride compound semiconductor according to Embodiment 8 has, as illustrated in FIG. 10, a GaN heat dissipation layer 280 in the recess 120 in the nitride compound semiconductor stack 11 according to Embodiment 2. The structural portions identical to those in Embodiments 1 to 7 above are given the same numerals as in Embodiments 1 to 7. To these structural portions, the descriptions in Embodiments 1 to 7 apply.

Besides being contiguous to the GaN channel layer 5, the multilayer buffer layer 4, and the composition-gradient buffer layer 3, the heat dissipation layer 280 leaves part of the GaN channel layer 5 exposed in the recess 120.

The production of the nitride compound semiconductor according to Embodiment 8 is through, for example, the same process as that of the nitride compound semiconductor according to Embodiment 1.

In the nitride compound semiconductor according to Embodiment 8, the heat dissipation layer 280 leaves part of the GaN channel layer 5 exposed in the recess 120. This will reduce the leakage current that will flow across the interface between the heat dissipation layer 280 and the GaN channel layer 5.

The GaN channel layer 5 in Embodiments 1 to 8 above is on the multilayer buffer layer 4, 104, but its position is not limited to this. For example, there may be an AlN layer between the multilayer buffer and GaN channel layers. This gives the manufacturer control over the warp in the nitride compound semiconductor.

The heat dissipation layer 210, 220, 260, 270, 280 will work if it is contiguous to the multilayer buffer layer 4, 104 and to at least part of a layer on this multilayer buffer layer 4, 104. For example, placing the heat dissipation layer 210, 220, 260, 270, 280 not to make the channel section of the GaN channel layer 5 contiguous to the heat dissipation layer 210, 220, 260, 270, 280 will reduce the leakage current that will flow across the interface between the heat dissipation layer 210, 220, 260, 270, 280 and the GaN channel layer 5.

The present invention and embodiments can be summarized as follows.

A nitride compound semiconductor according to the present invention has:
a substrate 1; and
a nitride compound semiconductor stack 11, 12, 13, 14, 15, 16 on the substrate 1.

The nitride compound semiconductor stack 11, 12, 13, 14, 15, 16 includes a multilayer buffer layer 4, 104, a channel layer 5 on this multilayer buffer layer 4, 104, and an electron supply layer 6, 106 on this channel layer 5.

In the nitride compound semiconductor,
a recess 110, 120, 130, 140, 150, 160 extends from the surface of the electron supply layer 6, 106 through the channel layer 5 and the multilayer buffer layer 4, 104; and
a heat dissipation layer 210, 220, 260, 270, 280 is in the recess 110, 120, 130, 140, 150, 160 contiguous to the multilayer buffer layer 4, 104 and the layer 5 on this multilayer buffer layer 4, 104 and has a higher thermal conductivity than the multilayer buffer layer 4, 104.

A nitride compound semiconductor in this structure has a recess 110, 120, 130, 140, 150, 160 that extends from the surface of the electron supply layer 6, 106 through the electron supply layer 6, 106, the GaN channel layer 5, and the multilayer buffer layer 4, 104. In this recess 110, 120, 130, 140, 150, 160, there is a heat dissipation layer 210, 220, 260, 270, 280 contiguous to the multilayer buffer layer 4, 104 and the layer 5 on this multilayer buffer layer 4, 104 and having a higher thermal conductivity than the multilayer buffer layer 4, 104. This improves the dissipation of heat from the nitride compound semiconductor, which includes a multilayer buffer layer 4, 104 having a low thermal conductivity in a direction perpendicular to the substrate 1, by ensuring that the heat transmitted from the surface of the electron supply layer 6, 106 toward the multilayer buffer layer 4, 104 is released to the outside of the nitride compound semiconductor through the heat dissipation layer 210, 220, 260, 270, 280. This nitride compound semiconductor therefore makes semiconductor electron devices using the nitride compound semiconductor highly reliable, such as improved in terms of short-circuit capacity.

In a nitride compound semiconductor according to an embodiment,
the multilayer buffer layer 4, 104 includes a first layer with a composition of $Al_xIn_yGa_{1-x-y}As_uP_vN_{1-u-v}$ ($0 \leq x \leq 1$, $0 \leq y \leq 1$, $x+y \leq 1$, $0 \leq u < 1$, $0 \leq v < 1$, and $u+v < 1$) and a second layer with a composition of $Al_aIn_bGa_{1-a-b}As_cP_dN_{1-c-d}$ ($0 \leq a \leq 1$, $0 \leq b \leq 1$, $a+b \leq 1$, $0 \leq c < 1$, $0 \leq d < 1$, and $c+d < 1$).

This embodiment improves the dissipation of heat from the nitride compound semiconductor, which includes a multilayer buffer layer 4, 104 having a low thermal conductivity in a direction perpendicular to the substrate 1, by ensuring that the heat transmitted from the surface of the electron supply layer 6, 106 toward the multilayer buffer layer 4, 104 is released to the outside of the nitride compound semiconductor through the heat dissipation layer 210, 220, 260, 270, 280. This nitride compound semiconductor therefore makes semiconductor electron devices using the nitride compound semiconductor highly reliable, such as improved in terms of short-circuit capacity.

In a nitride compound semiconductor according to an embodiment, the multilayer buffer layer 4, 104 is on a composition-gradient buffer layer 3, 103 composed of multiple AlGaN layers stacked in descending order of the composition of Al.

This embodiment gives the multilayer buffer layer 4, 104 high crystallinity and allows the manufacturer to control the warp in the nitride compound semiconductor. semiconductor.

In a nitride compound semiconductor according to an embodiment, the heat dissipation layer 210, 220, 260, 270, 280 has a composition of $Al_xIn_yGa_{1-x-y}As_uP_vN_{1-u-v}$ ($0 \leq x \leq 1$, $0 \leq y \leq 1$, $x+y \leq 1$, $0 \leq u < 1$, $0 \leq v < 1$, and $u+v < 1$).

In this embodiment, the composition of the heat dissipation layer 210, 220, 260, 270, 280 is close to that of the multilayer buffer layer 4, 104. This helps growing the heat dissipation layer 210, 220, 260, 270, 280 by epitaxy.

In a nitride compound semiconductor according to an embodiment, the composition-gradient buffer layer 3, 103 is composed of two to four AlGaN layers.

This embodiment gives the manufacturer detailed control over the warp in the nitride compound semiconductor.

In a nitride compound semiconductor according to an embodiment, the substrate 1 is a Si substrate.

This embodiment provides high heat dissipation capacity and allows for low-cost production.

In the nitride compound semiconductors according to Embodiments 1 to 8 above, the thickness, composition, and formation process for each layer in the nitride compound semiconductor stack 11, 13, 14, 15, 16 can optionally be changed according to factors such as the design of the nitride compound semiconductor and the adjustment of the warp in the wafer.

Naturally, the structural elements described in the above Embodiments 1 to 8 and variations may optionally be combined and may optionally be selected, replaced, or eliminated.

REFERENCE SIGNS LIST

1 Substrate
2, 102 Initial growth layer
3, 103 Composition-gradient buffer layer
4, 104 Multilayer buffer layer
5 GaN channel layer
6, 106 Electron supply layer
11, 13, 14, 15, 16 Nitride compound semiconductor stack
110, 120, 130, 140, 150, 160 Recess
210, 220, 260, 270, 280 Heat dissipation layer

The invention claimed is:

1. A nitride compound semiconductor comprising:
a substrate; and
a nitride compound semiconductor stack on the substrate,
the nitride compound semiconductor stack including a multilayer buffer layer, a channel layer on the multilayer buffer layer, and an electron supply layer on the channel layer, wherein:
a recess extends from a surface of the electron supply layer through the channel layer and the multilayer buffer layer;
a heat dissipation layer is in the recess, the heat dissipation layer being contiguous to the multilayer buffer layer and a layer on the multilayer buffer layer and has a higher thermal conductivity than the multilayer buffer layer; and
the heat dissipation layer has a composition of $Al_xIn_yGa_{1-x-y}As_uP_vN_{1-u-v}$ ($0 \leq x \leq 1$, $0 \leq y \leq 1$, $x+y \leq 1$, $0 \leq u < 1$, $0 \leq v < 1$, and $u+v < 1$).

2. The nitride compound semiconductor according to claim 1, wherein
the multilayer buffer layer includes a first layer with a composition of $Al_xIn_yGa_{1-x-y}As_uP_vN_{1-u-v}$ ($0 \leq x \leq 1$, $0 \leq y \leq 1$, $x+y \leq 1$, $0 \leq u < 1$, $0 \leq v < 1$, and $u+v < 1$) and a second layer with a composition of $Al_aIn_bGa_{1-a-b}As_cP_dN_{1-c-d}$ ($0 \leq a \leq 1$, $0 \leq b \leq 1$, $a+b \leq 1$, $0 \leq c < 1$, $0 \leq d < 1$, and $c+d < 1$).

3. The nitride compound semiconductor according to claim 1, wherein
the multilayer buffer layer is on a composition-gradient buffer layer composed of a plurality of AlGaN layers stacked in descending order of a composition of Al.

4. The nitride compound semiconductor according to claim 3, wherein the composition-gradient buffer layer is composed of two to four AlGaN layers.

5. The nitride compound semiconductor according to claim 1, wherein the substrate is a Si substrate.

* * * * *